United States Patent
Kita

(10) Patent No.: US 10,142,599 B2
(45) Date of Patent: Nov. 27, 2018

(54) IMAGE CAPTURING DEVICE WITH PHOTOELECTRIC CONVERSION UNITS AND DRIVE UNIT

(71) Applicant: NIKON CORPORATION, Tokyo (JP)

(72) Inventor: Yuki Kita, Kawasaki (JP)

(73) Assignee: NIKON CORPORATION, Tokyo (JP)

(*) Notice: Subject to any disclaimer, the term of this patent is extended or adjusted under 35 U.S.C. 154(b) by 42 days.

(21) Appl. No.: 14/905,608

(22) PCT Filed: Jul. 17, 2014

(86) PCT No.: PCT/JP2014/069034
§ 371 (c)(1),
(2) Date: May 2, 2016

(87) PCT Pub. No.: WO2015/012192
PCT Pub. Date: Jan. 29, 2015

(65) Prior Publication Data
US 2016/0255311 A1    Sep. 1, 2016

(30) Foreign Application Priority Data

Jul. 24, 2013   (JP) .................... 2013-153633

(51) Int. Cl.
*H04N 9/04*    (2006.01)
*H04N 9/07*    (2006.01)
(Continued)

(52) U.S. Cl.
CPC ....... *H04N 9/045* (2013.01); *H01L 27/14621* (2013.01); *H01L 27/14625* (2013.01);
(Continued)

(58) Field of Classification Search
CPC ......... H01L 27/14621; H01L 27/14625; H01L 27/14645; H01L 27/14647;
(Continued)

(56) References Cited

U.S. PATENT DOCUMENTS

2007/0063299 A1* 3/2007 Hwang ............ H01L 27/14603
257/432
2007/0076108 A1* 4/2007 Misawa ........... H01L 27/14609
348/294
(Continued)

FOREIGN PATENT DOCUMENTS

JP    2007-104114 A    4/2007
JP    2008-258430 A    10/2008
(Continued)

OTHER PUBLICATIONS

Oct. 14, 2014 Search Report issued in International Patent Application No. PCT/JP2014/069034.
(Continued)

*Primary Examiner* — Amy Hsu
(74) *Attorney, Agent, or Firm* — Oliff PLC

(57) ABSTRACT

An image capturing device includes: a plurality of first pixels that have a plurality of color components, and that generate first signals by photoelectrically converting incident light; a plurality of second pixels that generate second signals by photoelectrically converting light that has passed through the first pixels; and a drive unit that reads out the first signals from the first pixels, and that reads out the second signals from the second pixels at timings that are different from timings of reading out the first signals.

12 Claims, 9 Drawing Sheets

(51) Int. Cl.
*H01L 27/146* (2006.01)
*H04N 5/355* (2011.01)
*H04N 5/376* (2011.01)
*H04N 5/378* (2011.01)
*H04N 5/3745* (2011.01)

(52) U.S. Cl.
CPC .. *H01L 27/14645* (2013.01); *H01L 27/14647* (2013.01); *H04N 5/35545* (2013.01); *H04N 5/35563* (2013.01); *H04N 5/378* (2013.01); *H04N 5/3765* (2013.01); *H04N 5/37457* (2013.01); *H04N 9/07* (2013.01)

(58) Field of Classification Search
CPC ........... H04N 5/35545; H04N 5/35563; H04N 5/37457; H04N 5/378; H04N 9/045; H04N 9/07
See application file for complete search history.

(56) References Cited

U.S. PATENT DOCUMENTS

| | | | | |
|---|---|---|---|---|
| 2007/0194400 | A1* | 8/2007 | Yokoyama | H01L 27/14601 257/443 |
| 2009/0046185 | A1* | 2/2009 | Ota | H04N 5/23232 348/294 |
| 2010/0141771 | A1* | 6/2010 | Hu | H01L 27/14621 348/164 |
| 2012/0127334 | A1* | 5/2012 | Imai | H04N 9/045 348/223.1 |
| 2012/0268566 | A1* | 10/2012 | Kim | H04N 5/3696 348/46 |
| 2013/0033628 | A1* | 2/2013 | Yamaguchi | H01L 27/14632 348/294 |
| 2013/0057699 | A1* | 3/2013 | Ooki | H01L 27/14621 348/164 |
| 2013/0093923 | A1 | 4/2013 | Imagawa et al. | |
| 2013/0182173 | A1 | 7/2013 | Murata | |
| 2014/0021574 | A1* | 1/2014 | Egawa | H01L 27/1461 257/432 |
| 2015/0222833 | A1* | 8/2015 | Murata | G02B 7/34 250/208.1 |

FOREIGN PATENT DOCUMENTS

| | | |
|---|---|---|
| JP | 2013-026950 A | 2/2013 |
| JP | 2013-070030 A | 4/2013 |
| WO | 2009/066909 A2 | 5/2009 |
| WO | 2012/081175 A1 | 6/2012 |
| WO | 2012/169127 A1 | 12/2012 |

OTHER PUBLICATIONS

Jun. 6, 2017 Office Action issued in Japanese Patent Application No. 2013-153633.
Jan. 24, 2017 Extended Search Report issued in European Patent Application No. 14829994.4.
Jan. 9, 2018 Office Action issued in Japanese Application No. 2013-153633.
Mar. 20, 2018 Office Action issued in European Application No. 14 829 994.4.

\* cited by examiner

FIG.3

(a) PIXEL ARRANGEMENT OF UPPER PHOTOELECTRIC CONVERSION LAYER 31

| | 1 | 2 | 3 | 4 | 5 | 6 |
|---|---|---|---|---|---|---|
| 1 | Mg | Ye | Mg | Ye | Mg | Ye |
| 2 | Cy | Mg | Cy | Mg | Cy | Mg |
| 3 | Mg | Ye | Mg | Ye | Mg | Ye |
| 4 | Cy | Mg | Cy | Mg | Cy | Mg |
| 5 | Mg | Ye | Mg | Ye | Mg | Ye |
| 6 | Cy | Mg | Cy | Mg | Cy | Mg |
| 7 | Mg | Ye | Mg | Ye | Mg | Ye |
| 8 | Cy | Mg | Cy | Mg | Cy | Mg |
| 9 | Mg | Ye | Mg | Ye | Mg | Ye |
| 10 | Cy | Mg | Cy | Mg | Cy | Mg |

(b) PIXEL ARRANGEMENT OF LOWER PHOTOELECTRIC CONVERSION LAYER 32

(c) OUTPUTS FROM LOWER PHOTOELECTRIC CONVERSION LAYER 32

| | 1 | 2 | 3 | 4 | 5 | 6 |
|---|---|---|---|---|---|---|
| 1 | G | B | G | B | G | B |
| 2 | R | G | R | G | R | G |
| 3 | G | B | G | B | G | B |
| 4 | R | G | R | G | R | G |
| 5 | G | B | G | B | G | B |
| 6 | R | G | R | G | R | G |
| 7 | G | B | G | B | G | B |
| 8 | R | G | R | G | R | G |
| 9 | G | B | G | B | G | B |
| 10 | R | G | R | G | R | G |

FIG.7
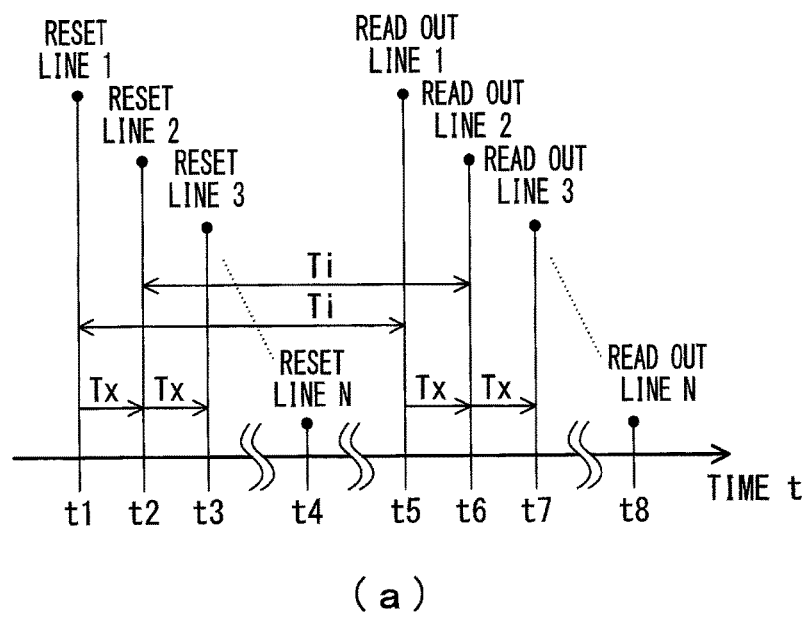
(a)
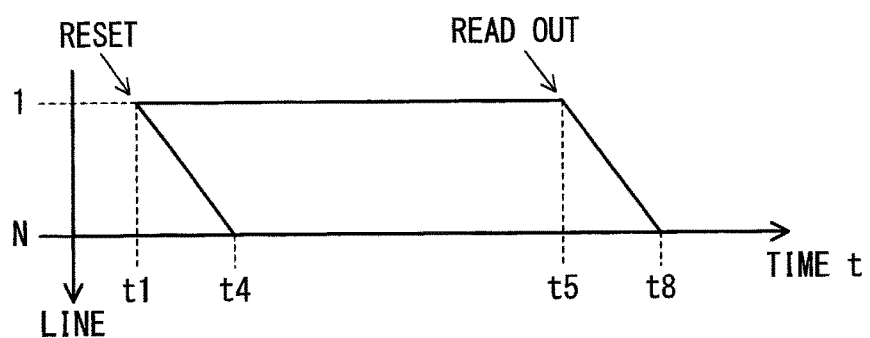
(b)

FIG.8
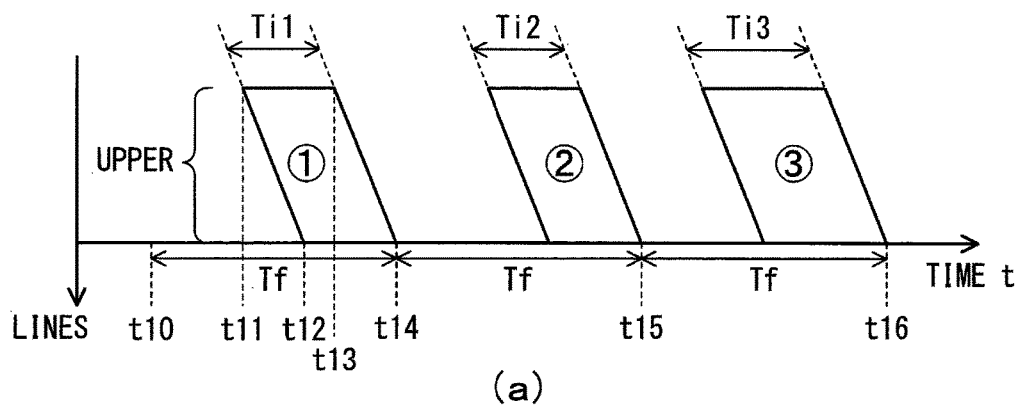
(a)
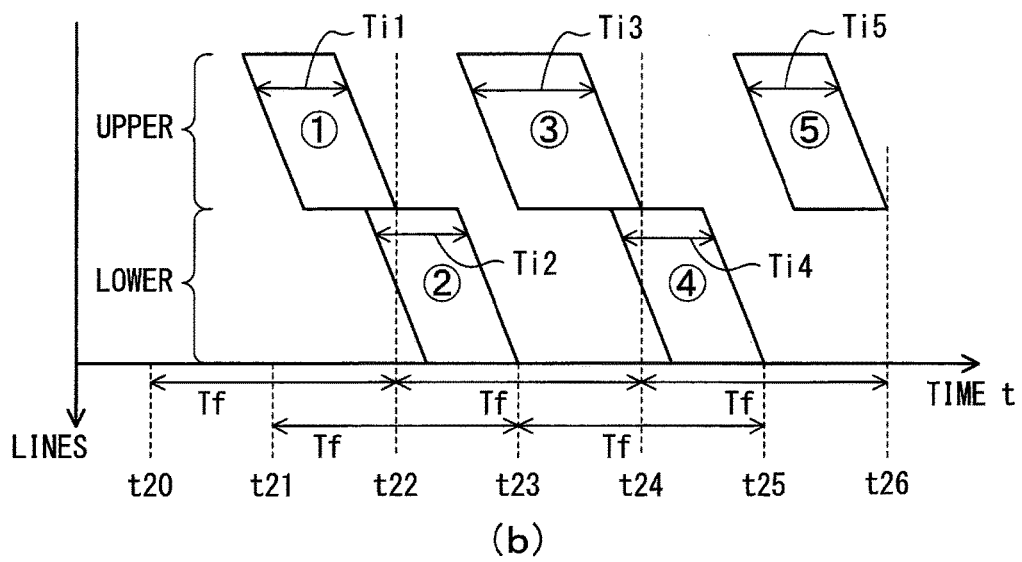
(b)

FIG.9
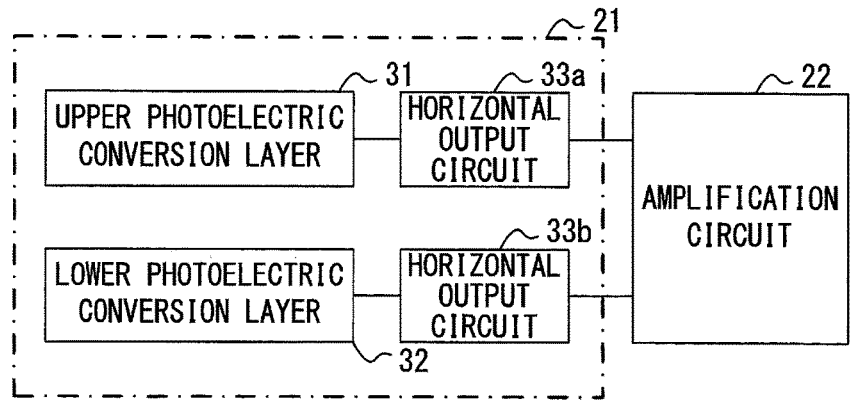
(a)
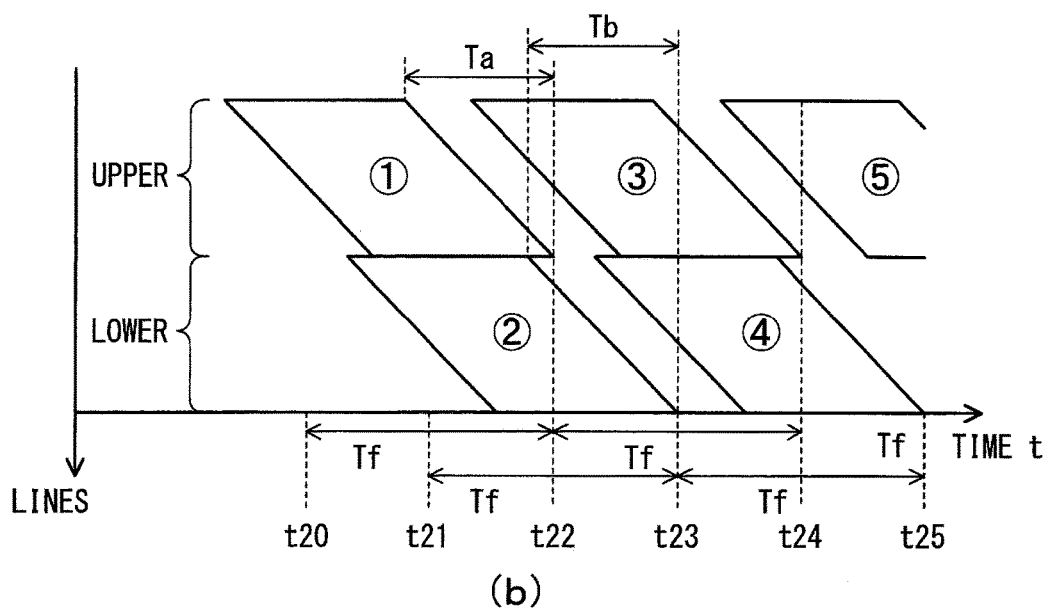
(b)

IMAGE CAPTURING DEVICE WITH PHOTOELECTRIC CONVERSION UNITS AND DRIVE UNIT

TECHNICAL FIELD

The present invention relates to an image capturing device.

BACKGROUND ART

In the prior art, when performing moving image photography in a dark place using an image capturing device that performs moving image photography, it is necessary to make the exposure time long, and, for doing so, it is known to reduce the frame rate. For example, an image processing device is described in PTL 1 that combines previously shot frames so that the integrated value of the exposure time becomes equal to a target exposure time, thus lessening the reduction in frame rate.

CITATION LIST

Patent Literature

PTL 1: Japanese Laid-Open Patent Publication 2013-26950

SUMMARY OF INVENTION

Technical Problem

With this prior art technique there has been the problem that the influence of noise becomes high, since the images of a plurality of frames are combined to increase an apparent frame rate.

Solution to Problem

An image capturing device according to a first aspect of the present invention, comprises: a plurality of first pixels that have a plurality of color components, and that generate first signals by photoelectrically converting incident light; a plurality of second pixels that generate second signals by photoelectrically converting light that has passed through the first pixels; and a drive unit that reads out the first signals from the first pixels, and that reads out the second signals from the second pixels at timings that are different from timings of reading out the first signals.

According to a second aspect of the present invention, in the image capturing device according to the first aspect, it is preferable that the drive unit differentiates exposure timings of the first signals and exposure timings of the second signals.

According to a third aspect of the present invention, in the image capturing device according to the second aspect, it is preferable that the exposure timing of the first signals is an interval from when the first pixels are reset until the first signals are read out from the first pixels; and the exposure timing of the second signals is an interval from when the second pixels are reset until the second signals are read out from the second pixels.

According to a fourth aspect of the present invention, in the image capturing device according to the third aspect, it is preferable that the drive unit reads out the first signals and the second signals repeatedly on a predetermined cycle.

According to a fifth aspect of the present invention, in the image capturing device according to the fourth aspect, it is preferable that: the drive unit shifts the exposure timing of the second signals from the exposure timing of the first signals by just approximately half of the predetermined cycle.

According to a sixth aspect of the present invention, in the image capturing device according to the fifth aspect, it is preferable that: the drive unit makes an exposure time of the first signals approximately same as an exposure time of the second signals.

According to a seventh aspect of the present invention, in the image capturing device according to any one of the first to the sixth aspects, it is preferable that: the plurality of second pixels are arranged as overlapped with the plurality of first pixels upon a same optical paths.

According to an eighth aspect of the present invention, in the image capturing device according to any one of the first to the seventh aspects, it is preferable to further comprise: a moving image generation unit that generates a moving image in which image data generated based on the first signals and image data generated based on the second signals are arranged alternatingly.

According to a ninth aspect of the present invention, in the image capturing device according to any one of the first to the eighth aspects, it is preferable that: the drive unit controls operations of the first pixels and the second pixels according to a rolling shutter method in which electric charges that have been accumulated by pixels arranged along a same line are read out sequentially line by line.

According to a tenth aspect of the present invention, in the image capturing device according to any one of the first to the ninth aspects, it is preferable that: the plurality of first pixels comprise cyan pixels that photoelectrically convert cyan light, magenta pixels that photoelectrically convert magenta light, and yellow pixels that photoelectrically convert yellow light; and the plurality of second pixels comprise red pixels that photoelectrically convert red light that has passed through the cyan pixels, green pixels that photoelectrically convert green light that has passed through the magenta pixels, and blue pixels that photoelectrically convert blue light that has passed through the yellow pixels.

According to an eleventh aspect, in the image capturing device according to any one of the first to the tenth aspects, it is preferable that: the drive unit comprises a first drive circuit that reads out the first signals from the first pixels and a second drive circuit that reads out the second signals from the second pixels.

Advantageous Effect of Invention

According to the present invention, it is possible to increase the frame rate without causing the noise to increase.

BRIEF DESCRIPTION OF DRAWINGS

FIG. 3 shows drawings showing the arrangement of pixels in an upper photoelectric conversion layer 31 and in a lower photoelectric conversion layer 32;

FIG. 7 shows time charts schematically showing a drive control method for the upper photoelectric conversion layer 31;

FIG. 8 shows time charts for a single layer photographic mode and for a multiple layer photographic mode; and FIG. 9 shows drawings showing the structure of a digital camera according to a variant embodiment.

DESCRIPTION OF EMBODIMENTS

First Embodiment

Figure 1:
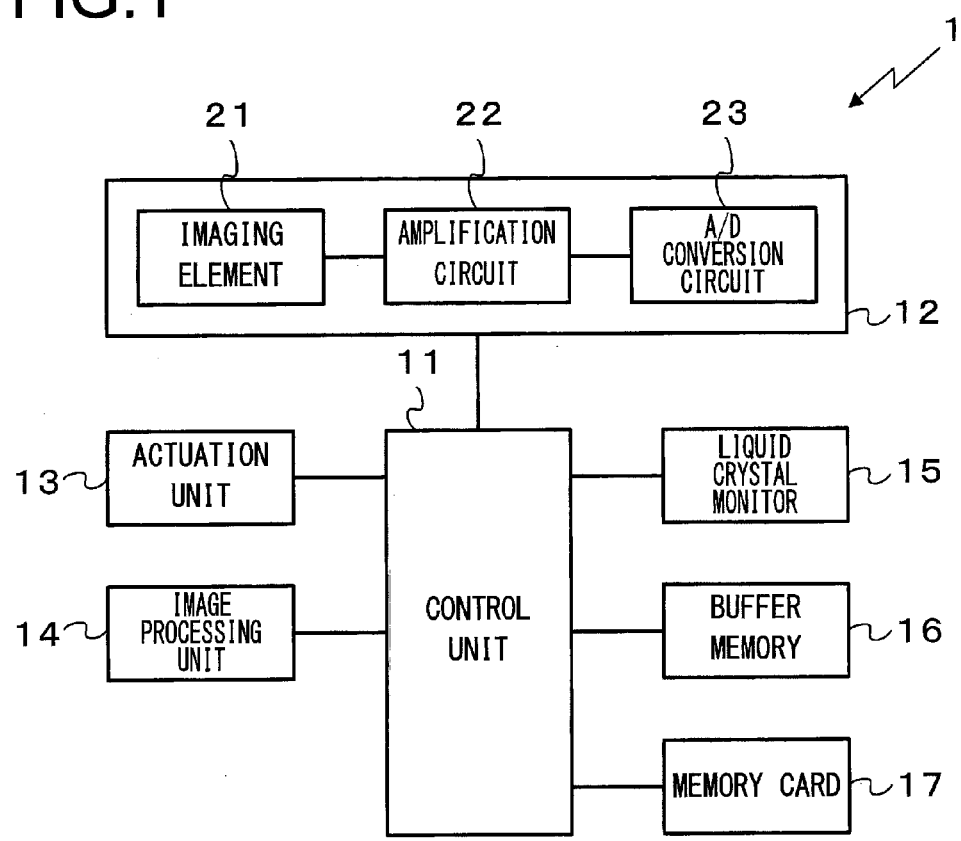
FIG. 1 is a figure showing an example of the structure of a digital camera 1 according to an embodiment of the present invention.

FIG. 1 is a figure showing an example of the structure of a digital camera 1 according to an embodiment of the present invention. This digital camera 1 includes a control unit 11, an image capturing unit 12, an actuation unit 13, an image processing unit 14, a liquid crystal monitor 15, and a buffer memory 16. Moreover, a memory card 17 is installed in the digital camera 1.

The control unit 11 includes a microprocessor and peripheral circuitry thereof, and performs control of various types for the digital camera 1 by executing a control program stored in a ROM not shown in the figures. The image capturing unit 12 comprises an imaging element 21, an amplification circuit 22, and an A/D conversion circuit 23.

The imaging element (image capturing element or image sensor) 21 includes a plurality of pixels, and receives light flux from a photographic subject via a photographic optical system not shown in the figures, performs photoelectric conversion thereupon, and outputs an analog image signal. The amplification circuit 22 amplifies the analog image signal outputted from the imaging element 21 by a predetermined amplification factor (gain), and outputs the result to the A/D conversion circuit 23. The A/D conversion circuit 23 performs A/D conversion upon this analog image signal and outputs a digital image signal. And the control unit 11 stores this digital image signal outputted from the image capturing unit 12 in the buffer memory 16.

Image processing of various kinds is performed by the image processing unit 14 upon the digital image signal stored in the buffer memory 16, and the result is displayed upon the liquid crystal monitor 15 and/or stored to the memory card 17. The memory card 17 includes a non-volatile flash memory or the like, and can be attached to or detached from the digital camera 1.

The actuation unit 13 includes actuation buttons of various types such as a release button, a mode changeover button, a power supply button, and so on, and is operated by the photographer. The actuation unit 13 outputs to the control unit 11 actuation signals corresponding to actuation by the photographer of the actuation buttons described above. The image processing unit 14 includes an ASIC and so on. The image processing unit 14 performs image processing of various types upon the image data captured by the image capturing unit 12, such as interpolation, compression, white balancing and so on.

Explanation of the Imaging Element 21

Figure 2:
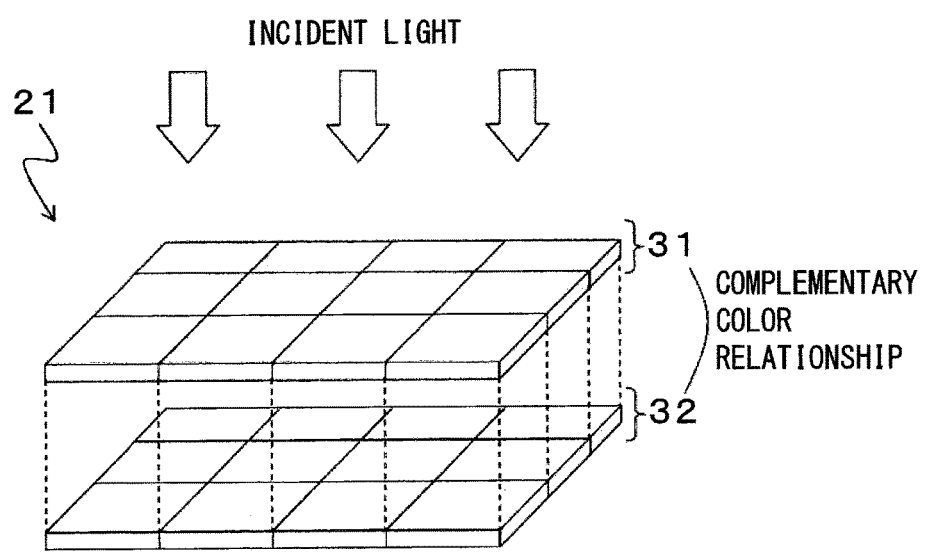
FIG. 2 is a summary figure showing an imaging element 21 according to this embodiment.

FIG. 2 is a figure showing a summary of the imaging element 21 according to this embodiment. It should be understood that, in FIG. 2, a state is shown in which the side of the imaging element 21 upon which light is incident is its upper side. Due to this, in the following explanation, the direction of the side of the imaging element 21 upon which light is incident will be termed "upward" or "above", while the direction of the opposite side to the side upon which light is incident will be termed "downward" or "below". The imaging element 21 has an upper photoelectric conversion layer 31 and a lower photoelectric conversion layer 32. The upper photoelectric conversion layer 31 and the lower photoelectric conversion layer 32 are arranged one above the other and lie upon the same optical path. The upper photoelectric conversion layer 31 is built with an organic photoelectric film that absorbs (i.e. photoelectrically converts) light having predetermined color components (this will be described in detail hereinafter). And light of the color components that have not been absorbed (i.e. photoelectrically converted) by the upper photoelectric conversion layer 31 passes through the upper photoelectric conversion layer 31 and is incident upon the lower photoelectric conversion layer 32, and is photoelectrically converted by the lower photoelectric conversion layer 32. The lower photoelectric conversion layer 32 performs photoelectric conversion with photo-diodes. It should be understood that the color components that are photoelectrically converted by the upper photoelectric conversion layer 31 and the color components that are photoelectrically converted by the lower photoelectric conversion layer 32 have a complementary color relationship. The upper photoelectric conversion layer 31 and the lower photoelectric conversion layer 32 are formed upon the same semiconductor substrate, and the positions of their pixels are in one-to-one correspondence. For example, the pixel in the first row and the first column of the upper photoelectric conversion layer 31 may correspond to the pixel in the first row and the first column of the lower photoelectric conversion layer 32.

FIG. 3(*a*) is a figure showing the arrangement of the pixels in the upper photoelectric conversion layer 31. In FIG. 3(*a*), the X axis is taken in the horizontal direction and the Y axis is taken in the vertical direction, and the coordinates of the pixels P are expressed as P(x,y). In the example of the upper photoelectric conversion layer 31 shown in FIG. 3(*a*), organic photoelectric films that photoelectrically convert Mg (magenta) light and Ye (yellow) light are disposed alternatingly in the pixels of the odd numbered rows, while organic photoelectric films that photoelectrically convert Cy (cyan) light and Mg (magenta) light are disposed alternatingly in the pixels of the even numbered rows. And light that is not received by each of the pixels passes through that pixel. For example, the pixel P(1,1) photoelectrically converts Mg light and passes G (green) light, which is the complementary color to Mg. In a similar manner, the pixel P(2,1) photoelectrically converts Ye light and passes B (blue) light, which is the complementary color to Ye, while the pixel P(1,2) photoelectrically converts Cy light and passes R (red) light, which is the complementary color to Cy.

FIG. 3(*b*) is a figure showing the arrangement of the pixels in the lower photoelectric conversion layer 32. It should be understood that the position of each of the pixels shown in FIG. 3(*b*) is the same as in FIG. 3(*a*). For example, the pixel (1,1) in the lower photoelectric conversion layer 32 corresponds to the pixel (1,1) in the upper photoelectric conversion layer 31. In FIG. 3(*b*) no color filter or the like is provided to the lower photoelectric conversion layer 32, so that light of the color components that passes through the upper photoelectric conversion layer 31 (in other words, light of the complementary colors to the color components that have been absorbed by the organic photoelectric layers and that have been photoelectrically converted thereby) are photoelectrically converted. Accordingly, as shown in FIG. 3(*c*), in the lower photoelectric conversion layer 32, image signals for the G and B color components are produced by the pixels in the odd numbered rows, while image signals for the R and G color components are produced by the pixels in the even numbered rows. For example an image signal for the G component, which is the complementary color to Mg, is produced by the pixel P(1,1). In a similar manner, an image signal for the B component, which is the complementary color to Ye, is obtained by the pixel P(2,1), while an image signal for the R component, which is the complementary color to Cy, is produced by the pixel P(1,2).

In this manner, with the imaging element 21 according to this embodiment, the upper photoelectric conversion layer 31 that is built with an organic photoelectric film fulfils the role of a color filter for the lower photoelectric conversion layer 32, and an color image is obtained from the lower photoelectric conversion layer 32 whose colors are complementary to those of the upper photoelectric conversion layer 31 (which, in the FIG. 3 example, is an image with a Bayer array). Accordingly, with the imaging element 21 according to this embodiment, it is possible to acquire a CMY image made up from the three colors Cy, Mg, and Ye from the upper photoelectric conversion layer 31, and it is possible to acquire a RGB image made up from the three colors R, G, and B from the lower photoelectric conversion layer 32.

Figure 4:
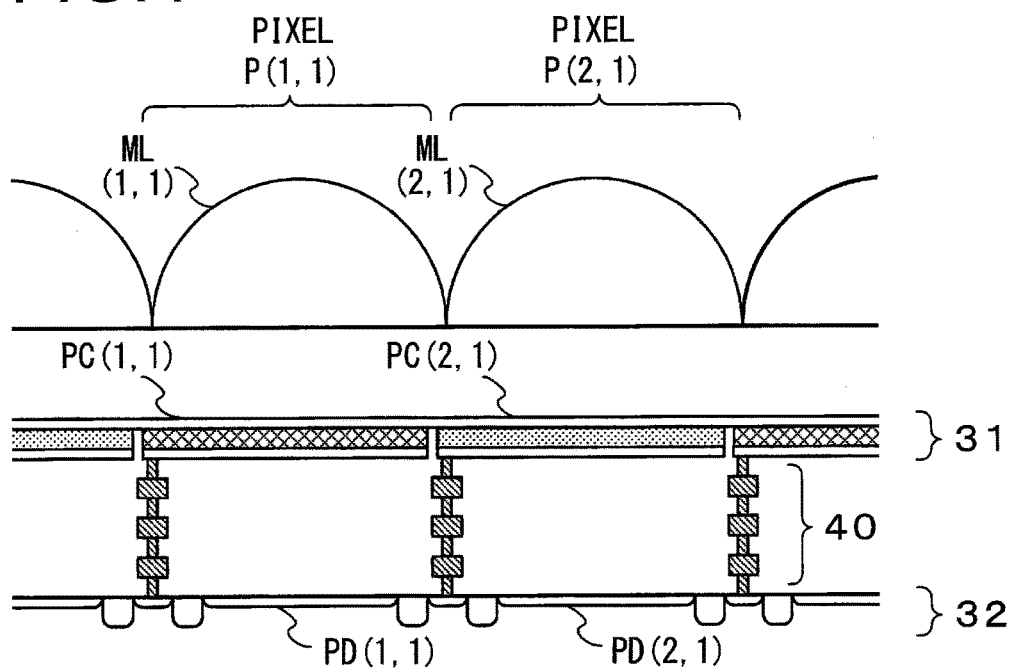
FIG. 4 is a figure showing one example of a partial cross section of the imaging element 21.

FIG. 4 is a figure showing one example of a partial cross section of the imaging element 21. As shown in FIG. 4, in this imaging element 21, the lower photoelectric conversion layer 32, which is formed upon the silicon substrate, and the upper photoelectric conversion layer 31, which employs an organic photoelectric film, are laminated together via a wiring layer 40. Above the upper photoelectric conversion layer 31, a single micro lens ML is formed for each individual pixel. For example, in the upper photoelectric conversion layer 31, a light reception unit PC(1,1), constituted with the organic photoelectric film that is the photoelectric conversion unit of the pixel P(1,1), photoelectrically converts Mg light in the light from the photographic subject that is incident from the micro lens ML(1,1) and passes G light which is the color complementary to the Mg light. And, in the lower photoelectric conversion layer 32, a photo-diode PD(1,1) in the pixel P(1,1) receives this G light that has passed through the light reception unit PC(1,1) of the upper photoelectric conversion layer 31, and photoelectrically converts this G light.

Figure 5:
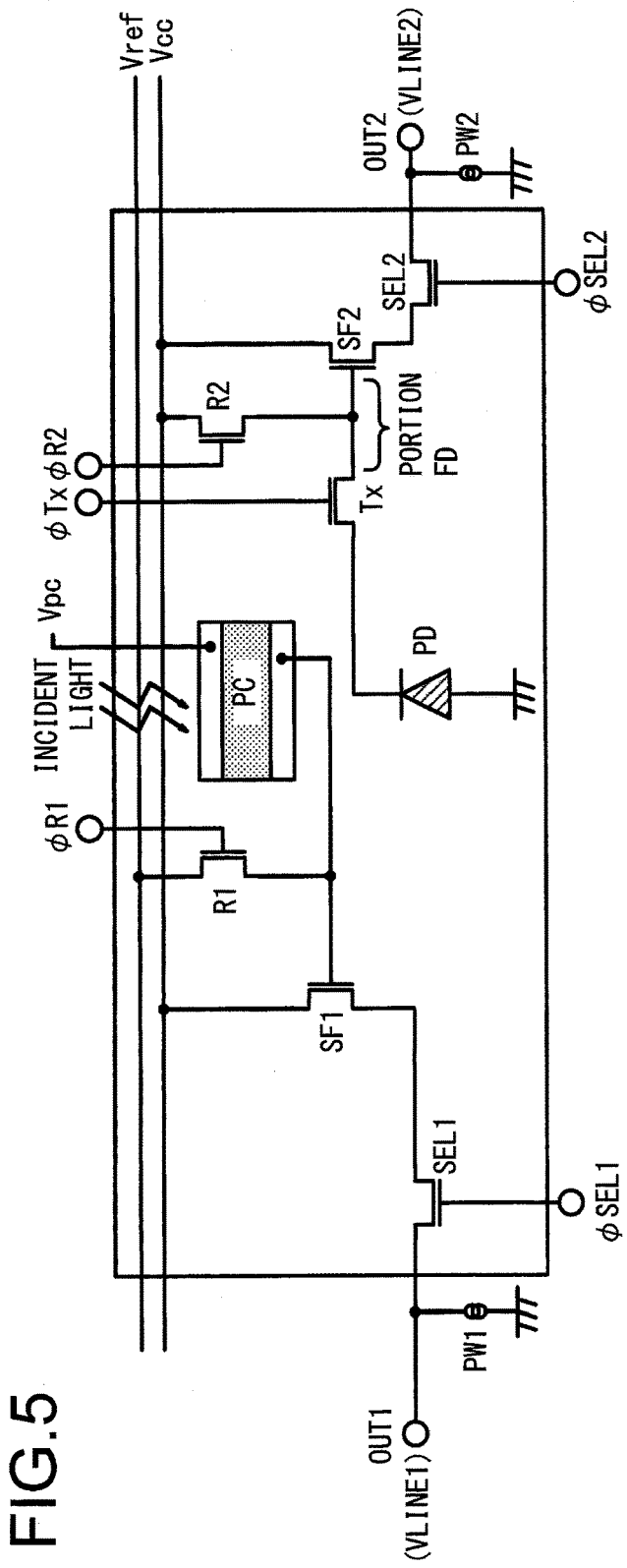
FIG. 5 is a figure showing an example of the circuit structure of a single pixel P(x,y) in the imaging element 21.

FIG. 5 is a figure showing an example of the circuit structure of a single pixel P(x,y) in the imaging element 21. As circuitry for the lower photoelectric conversion layer 32, this pixel P(x,y) includes a photo-diode PD, a transfer transistor Tx, a reset transistor R2, an output transistor SF2, and a selection transistor SEL2. The photo-diode PD accumulates electric charge corresponding to the amount of light incident thereupon. The transfer transistor Tx transfers the electric charge accumulated in the photo-diode PD to a floating diffusion region (a portion FD) toward the output transistor SF2. The output transistor SF2 constitutes a source follower with a current source PW2 via the selection transistor SEL2, and outputs an electrical signal corresponding to the electric charge accumulated in the portion FD to a vertical signal line VLINE2 as an output signal OUT2. It should be understood that the reset transistor R2 resets the electric charge in the portion FD to the power supply voltage Vcc.

Moreover, as circuitry for the upper photoelectric conversion layer 31, the pixel P(x,y) includes a light reception unit PC having the organic photoelectric film, a reset transistor R1, an output transistor SF1, and a selection transistor SEL1. The light reception unit PC having the organic photoelectric film converts the light that is not passed through into an electrical signal corresponding to the amount of this light, and outputs this signal as an output signal OUT1 to a vertical signal line VLINE1 via the output transistor SF1, which constitutes a source follower with a current source PW1 via the selection transistor SEL1. It should be understood that the reset transistor R1 resets the output signal of the light reception unit PC to a reference voltage Vref. Moreover, a high voltage Vpc is supplied for operation of the organic photoelectric film. Each of these transistors is a MOSFET.

Now, the operation of the circuitry related to the lower photoelectric conversion layer 32 will be explained. First, when a selection signal φSEL2 goes to "High", the selection transistor SEL2 goes ON. Next, when a reset signal φR2 goes to "High", the voltage at the portion FD is reset to the power supply voltage Vcc, and the output signal OUT2 also goes to the reset level. And, after the reset signal φR2 has gone to "Low", a transfer signal φTx goes to "High", the electric charge that has been accumulated by the photo-diode PD is transferred to the portion FD, and the output signal OUT2 starts to change according to the amount of this electric charge and becomes stable. And then the transfer signal φTx goes to "Low", so that the signal level of the output signal OUT2 read out from this pixel to the vertical signal line VLINE2 becomes fixed. And the output signals OUT2 of the pixels that have been read out to the vertical signal line VLINE2 are outputted from the imaging element 21, after having been temporarily stored for each row in a horizontal output circuit not shown in the figures. The signals from the pixels in the lower photoelectric conversion layer 32 of the imaging element 21 are read out in this manner.

Next, the operation of the circuitry related to the upper photoelectric conversion layer 31 will be explained. First, when a selection signal φSEL1 goes to "High", the selection transistor SEL1 goes ON. Next, when a reset signal φR1 goes to "High", the output signal OUT1 also goes to the reset level. And, directly after the reset signal φR1 has gone to "Low", accumulation of electric charge is started by the light reception unit PC constituted by the organic photoelectric film, and the output signal OUT1 changes according to the amount of this electric charge. And the output signals OUT1 are outputted from the imaging element 21, after having been temporarily stored for each row in a horizontal output circuit not shown in the figures. The signals from the pixels in the upper photoelectric conversion layer 31 of the imaging element 21 are read out in this manner.

Figure 6:
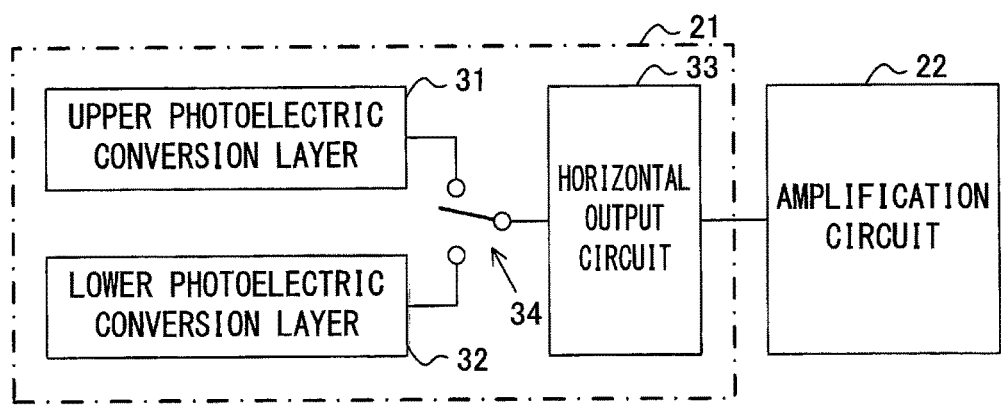
FIG. 6 is a schematic block diagram showing the structure of the upper photoelectric conversion layer 31 and the lower photoelectric conversion layer 32.

FIG. 6 is a schematic block diagram showing the structure of the upper photoelectric conversion layer 31 and the lower photoelectric conversion layer 32. The upper photoelectric conversion layer 31 and the lower photoelectric conversion layer 32 of the imaging element 21 are built so that they can each be driven individually. For example, it would be possible to perform image capture using the upper photoelectric conversion layer 31 and to perform image capture using the lower photoelectric conversion layer 32 simultaneously; or, alternatively, it would also be possible to perform image capture using the upper photoelectric conversion layer 31 and to perform image capture using the lower photoelectric conversion layer 32 at different timings. However, the imaging element 21 of this embodiment has only one horizontal output circuit 33. Accordingly it is arranged to provide a switch 34 between the upper photoelectric conversion layer 31, the lower photoelectric conversion layer 32, and the horizontal output circuit 33, so that the signal from one or the other of the upper photoelectric conversion layer 31 and the lower photoelectric conversion layer 32 can be outputted to the horizontal output circuit 33. In this case, for example, while reading out the signals from the pixels of the upper photoelectric conversion layer 31, it is not possible to read out the signals from the pixels of the lower photoelectric conversion layer 32. The control unit 11 controls the driving of the imaging element 21 so that the timings of reading out the upper photoelectric conversion layer 31 and the timings of reading out the lower photoelectric conversion layer 32 do not overlap one another.

FIG. 7(a) presents a time chart schematically showing the drive control method for the upper photoelectric conversion layer 31. Drive control for this upper photoelectric conversion layer 31 is performed according to a so called rolling shutter method. This drive control according to a rolling shutter method will now be explained in a simple manner.

When an image of the photographic subject is to be captured with the upper photoelectric conversion layer 31, the control unit 11 resets the pixels P(1,1), P(2,1), P(3,1) . . . of the first line at a first time point t1. And, at a time point t2 that is a certain time interval Tx after the time point t1, the control unit 11 resets the pixels P(2,1), P(2,2), P(2,3) . . . of the second line. In a similar manner, the control unit 11 resets the pixels of the next line after each time interval Tx. And finally at the time point t4 the control unit 11 resets the pixels of the N-th line, which is the last line.

Thereafter, at a time point t5 that is a certain exposure time Ti after the time point t1 at which the pixels of the first line were reset, the control unit 11 reads out the electric charges that have been accumulated by the pixels of the first line. And then, at a time point t6 that is this exposure time Ti after the time point t2 at which the pixels of the second line were reset, the control unit 11 reads out the electric charges that have been accumulated by the pixels of the second line. In a similar manner, for the pixels of the third line, . . . the N-th line, the control unit 11 reads out the electric charges from the pixels of that line at the time points t7 . . . t8 after the exposure time Ti from the time points t3 . . . t4 when those pixels were reset. It should be understood that, although the time point t5 in FIG. 7(a) is taken as being a time point that is later than the time point t4 at which the pixels of the N-th line were reset, it would also be acceptable for this time point t5 to be a time point that is earlier than the time point t4.

This drive control method in which the timings of resetting and the timings of signal reading out are shifted for each line in this manner is a so called rolling shutter method. In the following explanation, the resetting and the reading out for each line shown in FIG. 7(a) will be shown on charts with the position of the subject line that is reset and read out being shown along the vertical axis and with time being shown along the horizontal axis, as in FIG. 7(b).

It should be understood that the drive control for the lower photoelectric conversion layer 32 is also performed according to a rolling shutter method, in a similar manner to that explained above for the upper photoelectric conversion layer 31.

Explanation of the Function for Moving Image Photography

The digital camera 1 of this embodiment has a function for moving image photography. When the user presses the release button, for example, the control unit 11 starts to photograph a moving image. And, when the user presses the release button again, the control unit 11 generates moving image data and stores this data upon the memory card 17.

This digital camera 1 has two types of moving image photographic mode: a single layer photographic mode and a multiple layer photographic mode. The user is able to set the digital camera 1 to either one of these two moving image photographic modes by, for example, operating the mode changeover button. In the following, these two types of moving image photographic mode will be explained in order.

1. The Single Layer Photographic Mode

A time chart for the single layer photographic mode is shown in FIG. 8(a). FIG. 8(a) is a chart in which the position of the line that is the subject of resetting and reading out is shown along the vertical axis and time is shown along the horizontal axis, as in FIG. 7(b). When the user presses the release button while the single layer photographic mode is set, the control unit 11 starts moving image photography. During this moving image photography, the control unit 11 repeatedly performs image capture with the upper photoelectric conversion layer 31 on a predetermined cycle Tf (for example every 1/30th of a second), and stores the digital image signal that has been obtained by image capture in the buffer memory 16.

Since the imaging element 21 and its peripheral circuitry are designed so that reading out from the upper photoelectric conversion layer 31 is performed a maximum of 30 times in one second, accordingly the moving image that is photographed has a maximum frame rate of 30 frames per second. It should be understood that the control unit 11 performs per se known exposure calculation repeatedly during this moving image photography, and repeatedly sets an optimum exposure time Ti as appropriate. Accordingly, the system is not limited to providing a fixed exposure time Ti for each frame.

For example in FIG. 8(a), in the interval from the time point t10 to the time point t16, the interval between the time points t10 and t14 is the interval for capture of the first frame, the interval between the time points t14 and t15 is the interval for capture of the second frame, and the interval between the time points t15 and t16 is the interval for capture of the third frame. The length of each of these image capture intervals is Tf (1/30th of a second). During each frame capture interval, the control unit 11 performs image capture with the upper photoelectric conversion layer 31, and generates an image of that frame.

When handling the capture of the image of the first frame, first from the time point t11, the control unit 11 sequentially performs resetting of the pixels from the first line. And at the time point t12 the resetting of the pixels from the final line is completed. Next, at the time point t13 at which an exposure time Ti1 has elapsed from the time point t11, the control unit 11 reads out the electric charges from each of the pixels on the first line. Thereafter, the control unit 11 sequentially reads out the electric charges, and at the time point t14 the reading out of the electric charges from the pixels of the final line is completed. Then the control unit 11 stores a digital image signal based upon the electric charges that were read out during the period from the time point t13 to the time point t14 in the buffer memory 16 as the image of the first frame.

The control unit 11 repeats similar processing upon the predetermined cycle Tf (one thirtieth of a second), and stores an image of each frame in the buffer memory 16. And, when the user presses the release button for a second time, the control unit 11 terminates image capture with the upper photoelectric conversion layer 31. And the control unit 11 generates moving image data in which the images of the frames that have been stored in the buffer memory 16 are arranged in order of time series, and stores this moving image data upon the memory card 17.

2. The Multiple Layer Photographic Mode

A time chart for the multiple layer photographic mode is shown in FIG. 8(b). When the multiple layer photographic mode is set, the control unit 11 repeatedly performs image capture with the upper photoelectric conversion layer 31 on a predetermined cycle (for example every 1/30th of a second), and, in parallel therewith, the control unit 11 also repeatedly performs image capture with the lower photoelectric conversion layer 32 on the same cycle. This image capture with the lower photoelectric conversion layer 32 is performed at timings that are delayed by half a frame (for example by 1/60th of a second) from the timings of image capture performed with the upper photoelectric conversion layer 31.

For example, in FIG. 8(b), during the interval from the time point t20 to the time point t26, the interval between the time points t20 and t22 is the interval for capture of the first frame by the upper photoelectric conversion layer 31, the interval between the time points t22 and t24 is the interval for capture of the third frame by the upper photoelectric conversion layer 31, and the interval between the time points t24 and t26 is the interval for capture of the fifth frame by the upper photoelectric conversion layer 31. Moreover, the interval between the time points t21 and t23, that straddles between the above interval for capture of the first frame and the above interval for capture of the third frame, is the interval for capture of the second frame by the lower photoelectric conversion layer 32, and the interval between the time points t23 and t25, that straddles between the above interval for capture of the third frame and the above interval for capture of the fifth frame, is the interval for capture of the fourth frame by the lower photoelectric conversion layer 32. In other words, the upper photoelectric conversion layer 31 captures the images for the odd numbered frames of the moving image, while the lower photoelectric conversion layer 32 captures the images for the even numbered frames of the moving image. By arranging the plurality of photographic images (i.e. their digital image signals) obtained through image capture by the upper photoelectric conversion layer 31 and the plurality of photographic images (i.e. their digital image signals) obtained through image capture by the lower photoelectric conversion layer 32 in time series order, the control unit 11 generates moving image data whose frame rate (for example 60 frames per second) is double the rate of image capture by the respective photoelectric conversion layers (for example 30 frames per second).

As described above, due to the fact that the control unit 11 performs image capture with the upper photoelectric conversion layer 31 and image capture with the lower photoelectric conversion layer 32 at timings that are different from one another, it is possible to perform moving image photography at a frame rate that is double the image capture rate of the imaging element 21. Moreover, if the amount of light is insufficient, as when performing photography in a dark location or the like, then, while in the single layer photographic mode it is necessary to reduce the frame rate of the moving image from, for example, 30 frames per second to 15 frames per second in order to ensure a sufficient exposure time, by contrast, in the case of the multiple layer photographic mode, it is possible to keep the frame rate of the moving image data at 30 frames per second by driving each of the upper photoelectric conversion layer 31 and the lower photoelectric conversion layer 32 at 15 frames per second.

According to the digital camera of the first embodiment described above, the following operations and advantages are obtained.

(1) The imaging element 21 includes the upper photoelectric conversion layer 31 and the lower photoelectric conversion layer 32. And the control unit 11, along with repeatedly reading out the electric charges accumulated by the pixels of the upper photoelectric conversion layer 31 on a predetermined cycle, also repeatedly reads out the electric charges accumulated by the pixels of the lower photoelectric conversion layer 32 on the same predetermined cycle at different timings. Since this is done, accordingly it is possible to increase the frame rate without causing increase of the noise.

(2) The control unit 11 controls operations of the upper photoelectric conversion layer 31 and the lower photoelectric conversion layer 32 according to a rolling shutter method, in which the electric charges accumulated by pixels that are arranged along the same line are read out in sequence, line by line. Since this is done, accordingly it is possible to increase the frame rate without causing increase of the noise.

(3) After the timing at which the electric charges on the upper photoelectric conversion layer 31 have been read out, the control unit 11 reads out the electric charges at a timing that is just half a frame later. Since this is done, accordingly it is possible to perform moving image photography at a frame rate that is twice the rate at which the imaging element 21 is driven.

(4) The control unit 11 generates a moving image in which the image data that has been generated on the basis of the electric charges read out from the pixels of the upper photoelectric conversion layer 31 and the image data that has been generated on the basis of the electric charges read out from the pixels of the lower photoelectric conversion layer 32 are arranged alternatingly. Since this is done, accordingly it is possible to perform moving image photography at a frame rate that is twice the rate at which the imaging element 21 is driven.

Variations of the following types also are included in the scope of the present invention; and it would also be possible to combine one or more of these variant embodiments with the embodiment described above.

Variant Embodiment #1

While, in the embodiment described above, the image capture timing of the lower photoelectric conversion layer 32 was delayed by just half a frame, it would also be acceptable to arrange to delay that timing by just one third of a frame, so as to obtain a moving image at a frame rate that is three times the image capture rate. In this case, the first frame, the fourth frame, the seventh frame . . . would be generated by image capture by the upper photoelectric conversion layer 31, and the second frame, the fifth frame, the eighth frame . . . would be generated by image capture by the lower photoelectric conversion layer 32. And the remaining frames, i.e. the third frame, the sixth frame, the ninth frame . . . would be generated by interpolation from the results of image capture by the upper photoelectric conversion layer 31 and the results of image capture by the lower photoelectric conversion layer 32. For example, the image of the third frame might be generated from the image of the second frame and the image of the fourth frame. In other words, in each set of three consecutive frames, one would be generated from the result of image capture by the upper photoelectric conversion layer 31, one would be generated from the result of image capture by the lower photoelectric conversion layer 32, and the remaining one would be generated from those two by interpolation. It should be understood that it would also be acceptable to arrange, among the three consecutive frames, for some frame other than the first frame to be generated by the upper photoelectric conversion layer 31, and/or for some frame other than the second frame to be generated by the lower photoelectric conversion layer 32.

Variant Embodiment #2

In the embodiment described above, the odd numbered frames were generated from the results of image capture by the upper photoelectric conversion layer 31, while the even numbered frames were generated from the results of image capture by the lower photoelectric conversion layer 32. Conversely thereto, it would also be acceptable to arrange for the odd numbered frames to be generated from the results of image capture by the lower photoelectric conversion layer 32, while the even numbered frames are generated from the results of image capture by upper photoelectric conversion layer 31.

Variant Embodiment #3

As schematically shown in FIG. 9(a), it would also be acceptable to arrange for the imaging element 21 to have two horizontal output circuits 33a and 33b, so that the reading out of the pixels of the upper photoelectric conversion layer 31 and the reading out of the pixels of the lower photoelectric conversion layer 32 can be performed at the same time. In this case, one of the horizontal output circuits 33a corresponds to the upper photoelectric conversion layer 31, while the other horizontal output circuit 33b corresponds to the lower photoelectric conversion layer 32. By doing this, it is still possible to apply the present invention, even if the reading out takes a long time due to some reason, such as, for example, the number of lines being great, so that, as shown in FIG. 9(b), the time interval Ta for reading out the upper photoelectric conversion layer 31 and the time interval Tb for reading out the lower photoelectric conversion layer 32 overlap one another.

Variant Embodiment #4

In the embodiment described above, an example was explained in which moving image photography was performed using the imaging element 21 in which two photoelectric conversion layers (i.e. the upper photoelectric conversion layer 31 and lower photoelectric conversion layer 32) were laminated together. However, it would also be acceptable to arrange for the drive control described above also to be performed during sequential or continuous photography of still images, so that it is possible to photograph still images at twice the speed.

Variant Embodiment #5

The arrangement of the pixels of the imaging element 21 explained in connection with the embodiment described above is only an example, and other arrangements of these pixels would also be acceptable. For example, it would also be acceptable to dispose the pixels that perform photoelectric conversion of R, G, and B light in the upper photoelectric conversion layer 31, and to dispose the pixels that perform photoelectric conversion of Cy, Mg, and Ye light in the lower photoelectric conversion layer 32.

Variant Embodiment #6

In the embodiment described above, an example was explained in which moving image photography was performed using the imaging element 21 in which two photoelectric conversion layers (i.e. the upper photoelectric conversion layer 31 and lower photoelectric conversion layer 32) were laminated together. However, the present invention is not limited to the use of two layers; it would also be acceptable to arrange to perform moving image photography using an imaging element in which three or more photoelectric conversion layers were laminated together. For example, an imaging element in which three photoelectric conversion layers are laminated together may be provided, and image capture may be performed with this imaging element. And in this case the frame rate is enhanced by, in each sequence of three consecutive frames, generating the first frame with the first photoelectric conversion layer, the second frame with the second photoelectric conversion layer, and the third frame with the third photoelectric conversion layer.

Variant Embodiment #7

In the embodiment described above, an example was explained in which moving image photography was performed using the imaging element 21 in which two photoelectric conversion layers (i.e. the upper photoelectric conversion layer 31 and lower photoelectric conversion layer 32) were laminated together. However, instead of two photoelectric conversion layers, it would also be possible to employ two imaging elements. For example, it may be arranged to divide the light from the photographic subject with a pellicle mirror or the like, and to direct the divided light beams from the photographic subject to be incident upon these two imaging elements, respectively. And the system may be arranged so that the imaging surfaces of these two imaging elements become approximately optically equivalent (for example, so that the lengths of the optical paths from the pellicle mirror to the imaging surfaces of the two imaging elements become approximately equal to one another).

While various embodiments and variant embodiments have been explained in the above description, the present invention is not to be considered as being limited by the details thereof. Other forms of implementation that are considered to come within the range of the technical concept of the present invention are also included in the scope of the present invention.

The disclosure of the following priority application is herein incorporated by reference:

Japanese Patent Application No. 2013-153633 (filed on Jul. 24, 2013)

REFERENCE SIGNS LIST

1 . . . digital camera, 11 . . . control unit, 14 . . . image processing unit, 21 . . . imaging element, 31 . . . upper photoelectric conversion layer, 32 . . . lower photoelectric conversion layer

The invention claimed is:

1. An image capturing device, comprising:
a first photoelectric conversion unit that photoelectrically converts light of a first color out of incident light to generate first signals and transmits light of a complementary color of the first color;
a second photoelectric conversion unit that photoelectrically converts the light of the complementary color that has transmitted through the first photoelectric conversion unit to generate second signals;
a drive unit that reads out the first signals from the first photoelectric conversion unit, and that reads out the second signals from the second photoelectric conversion unit at timing that is different from timing of reading out the first signals; and
a moving image generation unit that generates a moving image in which image data generated based on the first signals and image data generated based on the second signals are arranged alternatingly.

2. The image capturing device according to claim 1, wherein:
the first photoelectric conversion unit includes a plurality of first pixels that photoelectrically convert the light of the first color out of the incident light and transmit the light of the complementary color of the first color, and a plurality of second pixels that photoelectrically convert light of a second color out of the incident light and transmit light of a complementary color of the second color; and the second photoelectric conversion unit includes third pixels that photoelectrically convert the light of the complementary color that has transmitted through the first pixels, and fourth pixels that photoelectrically convert the light of the complementary color that has transmitted through the second pixels.

3. The image capturing device according to claim 2, wherein:
the drive unit differentiates an exposure time of the first signals from an exposure time of the second signals.

4. The image capturing device according to claim 3, wherein:
the exposure time of the first signals is a time from when the first pixels are reset until the first signals are read out from the first pixels; and
the exposure time of the second signals is a time from when the second pixels are reset until the second signals are read out from the second pixels.

5. The image capturing device according to claim 4, wherein:
the drive unit reads out the first signals and the second signals repeatedly on a predetermined cycle.

6. The image capturing device according to claim 5, wherein:
the drive unit shifts timing at which the first signals are read out from the first pixels from timing at which the second signals are read out from the second pixels by approximately half of the predetermined cycle.

7. The image capturing device according to claim 2, wherein:
the drive unit makes an exposure time of the first signals approximately same as an exposure time of the second signals.

8. The image capturing device according to claim 2, wherein:
the plurality of second pixels are arranged as overlapped with the plurality of first pixels upon a same optical path.

9. The image capturing device according to claim 2, wherein:
the drive unit comprises a first drive circuit that reads out the first signals from the first pixels and a second drive circuit that reads out the second signals from the second pixels.

10. The image capturing device according to claim 1, wherein:

the first photoelectric conversion unit comprises cyan pixels that photoelectrically convert cyan light, magenta pixels that photoelectrically convert magenta light, and yellow pixels that photoelectrically convert yellow light; and
the second photoelectric conversion unit comprises red pixels that photoelectrically convert red light that has passed through the cyan pixels, green pixels that photoelectrically convert green light that has passed through the magenta pixels, and blue pixels that photoelectrically convert blue light that has passed through the yellow pixels.

11. An image capturing device, comprising:
a first photoelectric conversion unit including pixels that photoelectrically convert visible light of a first color out of incident light;
a second photoelectric conversion unit including pixels that photoelectrically convert visible light of a second color that is different from the visible light of the first color and has transmitted through the first photoelectric conversion unit;
a drive unit that reads out first signals from the first photoelectric conversion unit at first timing, and that reads out second signals from the second photoelectric conversion unit at second timing that is different from the first timing of reading out the first signals; and
a moving image generation unit that generates a moving image in which image data generated based on the first signals and image data generated based on the second signals are arranged alternatingly.

12. An image capturing device, comprising:
a first photoelectric conversion unit that is constituted by an organic photoelectric film and photoelectrically converts light of a first color out of incident light to generate first signals;
a second photoelectric conversion unit that is formed on a semiconductor substrate and photoelectrically converts light of a complementary color that has transmitted through the first photoelectric conversion unit to generate second signals;
a drive unit that reads out the first signals from the first photoelectric conversion unit, and that reads out the second signals from the second photoelectric conversion unit at timing that is different from timing of reading out the first signals; and
a moving image generation unit that generates a moving image in which image data generated based on the first signals and image data generated based on the second signals are arranged alternatingly.

* * * * *